(12) United States Patent
Bichler et al.

(10) Patent No.: US 11,667,837 B2
(45) Date of Patent: Jun. 6, 2023

(54) PHOSPHOR, METHOD OF PRODUCING A PHOSPHOR, AND RADIATION EMITTING DEVICE

(71) Applicant: OSRAM Opto Semiconductors GmbH, Regensburg (DE)

(72) Inventors: Daniel Bichler, Augsburg (DE); Simon Dallmeir, Biessenhofen (DE); Gudrun Plundrich, Landsberg am Lech (DE); Mark Vorsthove, Augsburg (DE); Simon Peschke, Assling (DE); Jutta Thoma, Horgau (DE); Christian Koch, Oberottmarshausen (DE); Johanna Strube-Knyrim, Weil (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 17/635,394

(22) PCT Filed: Aug. 12, 2020

(86) PCT No.: PCT/EP2020/072646
§ 371 (c)(1),
(2) Date: Feb. 15, 2022

(87) PCT Pub. No.: WO2021/032569
PCT Pub. Date: Feb. 25, 2021

(65) Prior Publication Data
US 2022/0290047 A1     Sep. 15, 2022

(30) Foreign Application Priority Data
Aug. 16, 2019 (DE) .................. 10 2019 122 063.7

(51) Int. Cl.
C09K 11/77 (2006.01)
H01L 33/50 (2010.01)

(52) U.S. Cl.
CPC ...... C09K 11/77347 (2021.01); H01L 33/502 (2013.01)

(58) Field of Classification Search
CPC .................. C09K 11/77347; H01L 33/502
See application file for complete search history.

(56) References Cited

U.S. PATENT DOCUMENTS

| | | | |
|---|---|---|---|
| 2013/0207535 A1 | 8/2013 | Hirosaki et al. | |
| 2016/0312118 A1 | 10/2016 | Fiedler et al. | |
| 2017/0314745 A1 | 11/2017 | Schmidt et al. | |
| 2021/0179934 A1 | 6/2021 | Seibald et al. | |

FOREIGN PATENT DOCUMENTS

| | | |
|---|---|---|
| CN | 105914287 A | 8/2016 |
| WO | 2006072918 A1 | 7/2006 |
| WO | 2010119375 A1 | 10/2010 |
| WO | 2017076970 A1 | 5/2017 |
| WO | WO 2019/238496 | * 12/2019 |

OTHER PUBLICATIONS

International Search Report issued for the corresponding international application No. PCT/EP2020/072646, dated Nov. 27, 2020, 4 pages (for informational purposes only).
German Search Report issued for the corresponding german application No. 10 2019 122 063.7, dated May 26, 2020, 3 pages (for informational purposes only).
Gong, Y et al., "Fluorescence and phosphorescence properties of new long-lasting phosphor Ba4(Si3O8)2:EU2+,Dy3+", Optics Express, dated Feb. 28, 2011, 6 pages, vol. 19, No. 5.
Zhang, X. et al., "Photoluminescence properties of blue-emitting Li4SrCa(SiO4)2:Eu2+ phosphor for solid-state lighting", Applied Physics B., dated 2010, pp. 279-284.
Chinese Office Action issued for the corresponding CN patent application No. 202080057996.3, dated Feb. 18, 2023, 7 pages (For informational purposes only).
Huang, S., "Preparation, Structure and Properties of Novel (Oxy)Nitrides in the Five-Component Ln—Si—Al—O—N System", Chinese Doctoral Dissertations, Full-text Database, Oct. 15, 2015.
Sikander A., et al., "Exploring the electronic structure and optical properties of new inorganic luminescent materials Ba(Si,Al)5(O,N)8 compounds for light-emitting diodes devices", Current Applied Physics, vol. 15, Issue. 10, Jul. 6, 2015, pp. 1160-1167.

* cited by examiner

*Primary Examiner* — C Melissa Koslow
(74) *Attorney, Agent, or Firm* — Viering, Jentschura & Partner MBB (57) ABSTRACT

A phosphor may have the general formula $EA_2A_4D_3O_xN_{8-x}$:RE. EA may be selected from the group of divalent elements. A may be selected from the group of monovalent, divalent or trivalent elements. D may be selected from the group of trivalent or tetravalent elements. RE may be an activator element. $0 \leq x \leq 8$, and $\varepsilon(4+4y+3z)=3(8-x)+2x$ with the charge number y of element A, the charge number z of element D, and $\varepsilon=0.9\text{-}1.1$.

20 Claims, 10 Drawing Sheets

PHOSPHOR, METHOD OF PRODUCING A PHOSPHOR, AND RADIATION EMITTING DEVICE

CROSS-REFERENCE TO RELATED APPLICATIONS

The present application is a national stage entry according to 35 U.S.C. § 371 of PCT application No.: PCT/EP2020/072646 filed on Aug. 12, 2020; which claims priority to German Patent Application Serial No.: 10 2019 122 063.7 filed on Aug. 16, 2019; all of which are incorporated herein by reference in their entirety and for all purposes.

TECHNICAL FIELD

A phosphor and a method for producing a phosphor are disclosed. In addition, a radiation emitting device is specified.

BACKGROUND

Among other things, it is an object to specify a phosphor with an increased efficiency. Further objects are to provide a method for producing a phosphor with an increased efficiency, and a radiation emitting device with an increased efficiency.

SUMMARY

A phosphor is specified. According to at least one embodiment, the phosphor comprises the general formula $EA_2A_4D_3O_xN_{8-x}$:RE, wherein
EA is selected from the group of divalent elements,
A is selected from the group of monovalent, divalent or trivalent elements,
D is selected from the group of trivalent or tetravalent elements,
RE is an activator element,
$0 \leq x \leq 8$, and
$\varepsilon(4+4y+3z)=3(8-x)+2x$ with the charge number y of element A, the charge number z of element D, and $\varepsilon=0.9-1.1$.

Here and in the following, phosphors are described using molecular formulae. The elements listed in the molecular formulae are present in charged form. Here and in the following, ions in the form of cations and anions are thus meant with elements or atoms in relation to the molecular formulae of the phosphors, even if this is not explicitly specified. This also applies to element symbols, if these are mentioned without charge number for the sake of clarity.

With the specified molecular formulae, it is possible that the phosphor comprises further elements, for example in the form of impurities. Combined, these impurities comprise at most 1 per mille, in particular at most 100 ppm (parts per million), such as at most 10 ppm. According to the molecular formula described here, the phosphor comprises only nitrogen and/or oxygen as anion. However, it cannot be ruled out that further elements, in particular anionic elements, are present in the form of impurities.

By the term "valence" in relation to a specific element, it is meant here how many elements with simple opposite charge are required in a chemical compound to achieve charge balance. Thus, the term "valence" includes the charge number of the element.

Elements with a valence of two are referred to as divalent elements. Divalent elements are often charged twice positively in chemical compounds and have a charge number of +2. A charge balance in a chemical compound can take place, for example, via two further elements which are charged single negatively or via a further element which is charged twice negatively. Divalent elements are generally selected from the group formed by the alkaline earth elements and zinc.

Monovalent elements are elements with valence of one. Monovalent elements are often charged single positively in chemical compounds and have a charge number of +1. A charge balance in a chemical compound can take place, for example, via an element that is charged single negatively. Monovalent elements are generally selected from the group formed by the alkali elements and copper, silver and gold.

Trivalent elements are elements with a valence of three. Trivalent elements are often charged triple positively in chemical compounds and have a charge number of +3. A charge balance in a chemical compound can take place, for example, via an element that is charged triple negatively or via three elements that are charged single negatively. Trivalent elements are generally selected from the group consisting of boron, aluminum, gallium, indium, scandium, yttrium and the rare earths.

Tetravalent elements are elements with a valence of four. Tetravalent elements are often charged four times positively in chemical compounds and have a charge number of +4. A charge balance in a chemical compound can take place, for example, via one element that is charged four times negatively, by two elements that are charged twice negatively, or four elements that are charged once negatively. Tetravalent elements are generally selected from the group consisting of silicon, germanium, tin, titanium, zirconium and hafnium.

The present phosphor comprises oxygen and/or nitrogen as anions. Oxygen and/or nitrogen serve as anions to balance the charge of the cations. The oxygen anions and the nitrogen anions can be interchanged almost as desired in the crystal lattice. The phosphor comprises a total of eight anions. The phosphor can comprise eight oxygen anions, eight nitrogen anions, or a mixture of a total of eight oxygen anions and nitrogen anions. The number of oxygen anions x may be selected from $0 \leq x \leq 8$. The number of nitrogen anions is then obtained from 8−x.

The present phosphor can be uncharged to the outside. This means that there can be a complete charge balance between positive and negative charges in the phosphor towards the outside. On the other hand, it is also possible that the phosphor formally lacks complete charge balance to a small extent. The charge balance of the present phosphor is given by $\varepsilon(4+4y+3z)=3(8-x)+2x$ with the charge number y of element A, the charge number z of element D, the number x of oxygen anions, and $\varepsilon=0.9-1.1$.

Such a phosphor can convert electromagnetic radiation of a particular wavelength or a particular wavelength range, hereinafter referred to as primary radiation, into electromagnetic radiation of a second wavelength or a second wavelength range, hereinafter referred to as secondary radiation. The conversion of primary radiation to secondary radiation is also referred to as wavelength conversion. In particular, in wavelength conversion, primary radiation is absorbed by a wavelength-converting element, converted into secondary radiation by electronic processes at the atomic and/or molecular level, and re-emitted. Primary and secondary radiation thus comprise wavelength ranges that are at least partially different from one another, wherein the secondary radiation comprises a longer wavelength range according to one embodiment. In particular, pure scattering or pure absorption of electromagnetic radiation is not meant here with the term "wavelength conversion".

Such a phosphor can thus—depending on the application—be used to generate cool white, warm white, yellow or green-yellow light, for example, in display applications and vehicle headlights. Compared to conventionally used yellow-emitting garnet phosphors, such as $Y_3Al_5O_{12}:Ce^{3+}$, which have a very high spectral half-width of more than 100 nm, the luminous efficacy or visual utility of the present phosphor is increased due to its narrow-band emission, i.e. an emission with a narrow spectral half-width.

According to one embodiment, the phosphor comprises a crystalline, for example ceramic, host lattice into which foreign elements are introduced as activator elements. The phosphor is, for example, a ceramic material.

The activator element changes the electronic structure of the host lattice in that primary radiation can be absorbed by the phosphor. The primary radiation can excite an electronic transition in the phosphor, which can return to the ground state by emitting secondary radiation. The activator element introduced into the host lattice is thus responsible for the wavelength-converting properties of the phosphor.

In particular, the crystalline host lattice is composed of a three-dimensional unit cell that is generally periodically repeated. With other words, the unit cell is the smallest recurring unit of the crystalline host lattice. The elements EA, A, D, O and N occupy fixed positions, so-called Wyckoff positions, of the three-dimensional unit cell of the host lattice. Furthermore, the activator element RE and the divalent element EA occupy equivalent Wyckoff positions. With other words, either EA or RE is located in the space described by the Wyckoff position of the element EA of a unit cell.

Six lattice parameters are needed to describe the three-dimensional unit cell of the crystalline host lattice, three lengths a, b, and c and three angles $\alpha$, $\beta$, and $\gamma$. The three lattice parameters a, b and c are the lengths of the lattice vectors spanning the unit cell. The other three lattice parameters $\alpha$, $\beta$ and $\gamma$ are the angles between these lattice vectors. $\alpha$ is the angle between b and c, $\beta$ is the angle between a and c, and $\gamma$ is the angle between a and b.

According to at least one embodiment, the lattice parameter a is in the range from 500 pm inclusive to 530 pm inclusive, the lattice parameter b is in the range from 1450 pm inclusive to 1500 pm inclusive, and the lattice parameter c is in the range from 520 pm inclusive to 560 pm inclusive. According to at least one further embodiment, the angles $\alpha$ and $\gamma$ are approximately 90° and the angle $\beta$ is in a region from 109.0° to 115.0°, inclusive.

According to at least one embodiment, the host lattice of the phosphor comprises a structure with a monoclinic space group. According to at least one embodiment, the phosphor crystallizes in the monoclinic space group Cm. In particular, the lattice parameters in the monoclinic space group Cm are a approximately equal to 516.11(8) pm, b approximately equal to 1479.7(2) pm, c approximately equal to 541.21(9) pm and the angles $\alpha$ and $\gamma$ are equal to 90° and the angle $\beta$ is approximately equal to 111.706(9°).

According to at least one embodiment, the phosphor absorbs primary radiation in the blue wavelength range, in particular from 400 nm inclusive to 520 nm inclusive, such as from 405 nm inclusive to 480 nm inclusive. According to a further embodiment, the phosphor converts primary radiation, in particular primary radiation in the blue wavelength range, into secondary radiation in the yellow or yellow-green wavelength range, in particular with an emission maximum from 500 nm inclusive to 600 nm inclusive and an integral position of the emission energy from 500 nm inclusive to 670 nm inclusive.

According to at least one embodiment, the phosphor comprises a host lattice comprising D centered $D(O,N)_4$ tetrahedra, A centered $A(O,N)_4$ tetrahedra, $A(O,N)_{3+1}$ units, and $A(O,N)_3$ units.

The $D(O,N)_4$ tetrahedra, the $A(O,N)_4$ tetrahedra, the $A(O,N)_{3+1}$ units and the $A(O,N)_3$ units are each spanned by O atoms and/or N atoms, depending on the composition of the phosphor.

The $D(O,N)_4$ tetrahedra, the $A(O,N)_4$ tetrahedra, the $A(O,N)_{3+1}$ units and the $A(O,N)_3$ units can thus be spanned by three or four O atoms or three or four N atoms or a mixture of a total of three or four O and N atoms.

The $D(O,N)_4$ tetrahedra and/or the $A(O,N)_4$ tetrahedra may comprise a tetrahedral gap. The tetrahedral gap is a region inside the respective tetrahedron. For example, the term "tetrahedral gap" is used to refer to the region inside the tetrahedron that is left vacant when spheres that touch each other are placed in the corners of the tetrahedron.

The oxygen atoms and/or the nitrogen atoms of the $D(O,N)_4$ tetrahedra and/or the $A(O,N)_4$ tetrahedra span the tetrahedron, wherein the D atom or the A atom is located in the tetrahedral gap of the spanned tetrahedron. In other words, the tetrahedra are centered around the D atom or the A atom. The D atom or the A atom are tetrahedrally surrounded by four oxygen atoms and/or nitrogen atoms. In particular, all the atoms spanning the tetrahedron have a similar distance to the D atom or the A atom located in the tetrahedral gap.

The $A(O,N)_3$ units are non-overcapped trigonal pyramids, i.e. approximately planar units, in the center of which there is an A atom surrounded trigonally or triangularly by a total of three O atoms and/or N atoms. All atoms which surround the A atom triangularly have a similar distance to the A atom.

In contrast, the $A(O,N)_{3+1}$ units are trigonal pyramids in which the A atom does not sit in the center but approximately on a side face, i.e., a trigonal-planar surrounded A atom with an overcapping by another O atom or N atom. Simplifying, both the A centered $A(O,N)_4$ tetrahedra and the overcapped $A(O,N)_{3+1}$ units can be referred to as $A(O,N)_4$ tetrahedra.

Two of each of the $A(O,N)_3$ units form a rhombus, which is spanned by two triangles of O atoms and/or N atoms. These triangles are symmetrically equivalent. The A atom can be located either in the first or in the second triangle. If the A atom is in one triangle, the other triangle can no longer be occupied by an A atom. Thus, the two symmetrically equivalent triangles have two symmetrically equivalent positions for the A atom, only one of which is occupied. The occupation of the symmetrically equivalent position with an A atom is mutually exclusive.

According to at least one embodiment, the host lattice comprises layers of corner-linked $D(O,N)_4$ tetrahedra, and the corner-linked $D(O,N)_4$ tetrahedra form eight-ring structures within the layers. In particular, the $D(O,N)_4$ tetrahedra are linked together via an oxygen atom or a nitrogen atom. In other words, the oxygen atom or nitrogen atom that links the $D(O,N)_4$ tetrahedra together is part of both $D(O,N)_4$ tetrahedra. One $D(O,N)_4$ tetrahedron is linked with at least two other $D(O,N)_4$ tetrahedra via one corner each within a layer. Eight $D(O,N)_4$ tetrahedra linked with at least two further $D(O,N)_4$ tetrahedra via one corner each form ring structures within a layer. In particular, each layer of corner-linked $D(O,N)_4$ tetrahedra comprises at least one eight-ring structure. In a further embodiment, each layer of corner-linked $D(O,N)_4$ tetrahedra comprises a plurality of interconnected eight-ring structures.

According to at least one embodiment, the layers of corner-linked $D(O,N)_4$ tetrahedra are linked via $A(O,N)_4$ tetrahedra and/or $A(O,N)_{3+1}$ units and/or $A(O,N)_3$ units. The $A(O,N)_4$ tetrahedra and/or $A(O,N)_{3+1}$ units and/or $A(O,N)_3$ units can thus connect $D(O,N)_4$ tetrahedra within a layer of corner-linked $D(O,N)_4$ tetrahedra or $D(O,N)_4$ tetrahedra from different layers of corner-linked $D(O,N)_4$ tetrahedra. The $D(O,N)_4$ tetrahedra are thereby corner-linked with the $A(O,N)_4$ tetrahedra and/or the $A(O,N)_{3+1}$ units and/or $A(O,N)_3$ units. In particular, an $A(O,N)_4$ tetrahedron and/or an $A(O,N)_{3+1}$ unit and/or an $A(O,N)_3$ unit may be linked with at least two $D(O,N)_4$ tetrahedra from one or two adjacent layers of corner-linked $D(O,N)_4$ tetrahedra. In this context, adjacent layers refer to layers arranged below and/or above, in particular adjoining layers.

According to at least one embodiment, $A(O,N)_{3+1}$ units and/or $A(O,N)_3$ units link the $D(O,N)_4$ tetrahedra from two adjacent layers of corner-linked $D(O,N)_4$ tetrahedra.

According to at least one embodiment, $A(O,N)_4$ tetrahedra link the $D(O,N)_4$ tetrahedra within a layer of corner-linked $D(O,N)_4$ tetrahedra. In particular, $D(O,N)_4$ tetrahedra can only be linked within their own layer via $A(O,N)_4$ tetrahedra and not with an adjacent layer.

According to at least one embodiment, the $A(O,N)_4$ tetrahedra and/or $A(O,N)_{3+1}$ units and/or $A(O,N)_3$ units linking the layers of corner-linked $D(O,N)_4$ tetrahedra form interstitial spaces, wherein at least one interstitial space contains an EA atom. In particular, an interstitial space is a cavity at least partially surrounded by $A(O,N)_4$ tetrahedra and/or $A(O,N)_{3+1}$ units and/or $A(O,N)_3$ units. Additionally, an interstitial space may be at least partially surrounded by $D(O,N)_4$ tetrahedra. In particular, the interstitial spaces are arranged between the layers of corner-linked $D(O,N)_4$ tetrahedra. In particular, EA atoms may be replaced by RE atoms on their Wyckoff positions.

According to at least one embodiment, EA is selected from Mg, Ca, Sr, Ba, or combinations thereof. According to at least one embodiment, EA comprises or consists of Sr.

According to at least one embodiment, A is selected from Li, Mg, Al, or combinations thereof. According to at least one embodiment, A comprises or consists of Li.

According to at least one embodiment, D is selected from Si, Al, Zr, Hf, Ge, Ga, or combinations thereof. According to at least one embodiment, D comprises or consists of Si.

According to at least one embodiment, RE is selected from the group of rare earth elements. In particular, RE is selected from Ce, Pr, Nd, Sm, Eu, Tb, Dy, Ho, Er, Yb, Tm. According to at least one embodiment, RE comprises Eu or Ce or consists of Eu or Ce.

According to at least one embodiment, the activator element comprises a molecular fraction between 0.001 inclusive and 0.1 inclusive relative to EA. In other words, between 0.1% inclusive and 10% inclusive of the Wyckoff positions of EA are occupied with RE. In particular, the molecular fraction of RE relative to EA is between 0.005 inclusive and 0.05 inclusive. Compared to garnet phosphors with weight fractions of rare earths of up to 70%, the fraction of rare earths in the present phosphor is significantly lower, making the raw materials comparatively inexpensive. Accordingly, the general formula $EA_2A_4D_3O_xN_{8-x}$:RE can also be expressed as follows: $(EA_{1-t}RE_t)_2A_4D_3O_xN_{8-x}$, wherein t is between 0.001 inclusive and 0.1 inclusive.

According to at least one embodiment, the phosphor comprises the formula $Sr_2Li_4Si_3O_4N_4$:RE. Such a phosphor is also referred to as a tectolithosilicate or framework lithosilicate. According to one embodiment, RE is $Eu^{2+}$ in this case.

According to at least one embodiment, the phosphor is present in particle form, in particular with particle sizes between 1 μm inclusive and 100 μm inclusive.

Further specified is a method for producing a phosphor. In a further embodiment, the phosphor according to the embodiments mentioned above is produced with the method described herein. In particular, all the explanations given for the phosphor also apply to the method and vice versa.

According to an embodiment of the method for producing a phosphor with the general formula $EA_2A_4D_3O_xN_{8-x}$:RE, wherein EA is selected from the group of divalent elements,
A is selected from the group of monovalent, divalent or trivalent elements,
D is selected from the group of trivalent or tetravalent elements,
RE is an activator element,
$0 \leq x \leq 8$, and
$\varepsilon(4+4y+3z)=3(8-x)+2x$ with the charge number y of element A, the charge number z of element D, and $\varepsilon = 0.9-1.1$, the method comprises the steps of
providing a stoichiometric composition of reactants,
heating the reactants to a temperature between 700° C. inclusive and 1100° C. inclusive.

With over 1400° C., the temperature for producing conventional phosphors, such as garnets, is generally much higher. In the present production method, on the other hand, the temperature is significantly reduced, resulting in a simplified production as well as improved energy efficiency.

According to at least one embodiment, the reactants are selected from a group comprising oxides, nitrides, carbonates, oxalates, imides and amides each of EA, A, D and RE and combinations thereof.

According to at least one embodiment, the reactants are selected from a group comprising $EA_3N_2$, EAO, $A_3N$, $A_2O$, $A_3N_2$, AO, $A_2O_3$, AN, $D_2O_3$, DN, $D_3N_4$, $DO_2$, $RE_2O_3$, and combinations thereof. Alternatively or additionally, the oxides and/or nitrides may be obtained from organic precursor compounds that form the reactants in situ. For example, the oxides may be obtained via decarboxylation of oxalates or from carbonates. For example, the nitrides may be obtained from imides or amides.

According to at least one embodiment, the reactants are homogenized in a first step of the method. The resulting mixture of reactants is placed in an open crucible, for example a nickel crucible. The mixture of reactants is heated in a furnace, in particular a gas pressure sintering furnace, under an inert gas atmosphere, in particular a nitrogen atmosphere, to provide reducing conditions. For example, the mixture of the reactants is heated to a temperature of about 900° C. for about 16 hours under a 100 bar nitrogen atmosphere.

According to at least one embodiment of the method, a stoichiometric composition of the reactants $Li_3N$, $Li_2O$, $Si_3N_4$, $SiO_2$, $Sr_3N_2$, SrO, and $Eu_2O_3$ is provided. In particular, a stoichiometric composition of these reactants is suitable for producing a phosphor of the formula $Sr_2Li_4Si_3O_4N_4:Eu^{2+}$.

A radiation emitting device comprising a phosphor is further specified. In a further embodiment, the phosphor according to the above embodiments is suitable and intended for use in a radiation emitting device described herein. Features and embodiments listed only in connection with the phosphor and/or the method also apply to the radiation emitting device, and vice versa.

A radiation emitting device is a device that emits electromagnetic radiation during operation. For example, the radiation emitting device is a light emitting diode (LED).

According to at least one embodiment, the radiation emitting device comprises a semiconductor chip that emits electromagnetic radiation of a first wavelength range during operation. The semiconductor chip may comprise an active layer sequence including an active region which, in operation of the device, can generate the electromagnetic radiation of the first wavelength range, the primary radiation. The semiconductor chip is, for example, a light emitting diode chip or a laser diode chip. The primary radiation generated in the semiconductor chip may be emitted through a radiation exit surface of the semiconductor chip. The primary radiation may form a beam path or follow a beam path.

In particular, the primary radiation can comprise wavelengths in the visible region. For example, the semiconductor chip emits a primary radiation in the blue spectral range, in particular in the wavelength range from 400 nm inclusive to 500 nm inclusive, such as from 405 nm inclusive to 480 nm inclusive.

According to at least one embodiment, the radiation emitting device comprises a conversion element comprising a phosphor with the general formula $EA_2A_4D_3O_xN_{8-x}$:RE that converts electromagnetic radiation of the first wavelength range into electromagnetic radiation of a second wavelength range, wherein
  EA is selected from the group of divalent elements,
  A is selected from the group of monovalent, divalent or trivalent elements,
  D is selected from the group of trivalent or tetravalent elements,
  RE is an activator element,
  $0 \leq x \leq 8$, and
  $\varepsilon(4+4y+3z)=3(8-x)+2x$ with the charge number y of element A, the charge number z of element D, and $\varepsilon=0.9$-$1.1$.

The properties of the phosphor have already been disclosed with respect to the phosphor and are equally applicable to the phosphor in the radiation emitting device. The phosphor completely or at least partially converts the primary radiation into electromagnetic radiation of a second wavelength range, the secondary radiation. In particular, the secondary radiation comprises wavelength ranges at least partially different from the primary radiation.

In particular, the conversion element is arranged in the beam path of the primary radiation in such a way that at least a part of the primary radiation impinges on the conversion element.

According to at least one embodiment, the conversion element is applied in direct contact to the radiation exit surface of the semiconductor chip.

According to at least one embodiment, the conversion element is applied to the radiation exit surface by means of an adhesive layer.

According to at least one embodiment, the semiconductor chip and the conversion element are arranged in the recess of a housing. According to a further embodiment, they are further at least partially surrounded by a casting.

According to at least one embodiment, the semiconductor chip and the conversion element are arranged in a recess of a housing, wherein the recess of the housing is filled with a casting that at least partially surrounds the semiconductor chip, and the conversion element is arranged on the side of the casting facing away from the semiconductor chip.

According to at least one embodiment, the semiconductor chip is arranged in the recess of a housing, wherein the recess of the housing is filled with a casting that at least partially surrounds the semiconductor chip and the conversion element is arranged on the side of the casting facing away from the semiconductor chip outside the recess of the housing.

Optionally, particles such as phosphors or scattering particles may be embedded within the casting.

According to at least one embodiment, the recess of the housing between the semiconductor chip and the conversion element may also be free of any casting or further layers or components.

According to at least one embodiment, the casting comprises a transmission of electromagnetic radiation, in particular of primary radiation, of at least 85%, in particular of at least 95%.

According to at least one embodiment, the casting comprises glass such as silicate, water glass or quartz glass, or polymers such as polystyrene, polysiloxane, polysilazane, PMMA, polycarbonate, polyacrylate, polytetrafluoroethylene, polyvinyl, silicone resin, silicone or epoxy resin, or combinations thereof.

Such a radiation emitting device can in particular generate narrowband radiation in the yellow wavelength range after excitation with blue primary radiation and thereby be used to generate cool white, warm white or—in case of full conversion—yellow or green-yellow light, for example in display applications and vehicle headlights.

According to at least one embodiment, the conversion element partially converts the primary radiation into secondary radiation, wherein the unconverted portion of the primary radiation is transmitted through the conversion element. In other words, a partial conversion of the primary radiation into secondary radiation takes place. In this case, the radiation emitting device emits a mixed light composed of the primary radiation and the secondary radiation. For example, the radiation emitting device emits cold white light composed of primary radiation in the blue spectral range and secondary radiation in the yellow spectral range. In particular, white light can be produced with a low color rendering index $R_a$ (CRI).

According to at least one embodiment, no primary radiation is transmitted through the conversion element. "No" in this context means that so little primary radiation is transmitted that it does not perceptibly influence the light emitted by the device. For example, at most 10%, in particular at most 5%, or at most 1% of the primary radiation is transmitted through the conversion element. The radiation emitting device then emits only the secondary radiation. In other words, a full conversion of the primary radiation into secondary radiation takes place. Thus, the conversion element completely converts the primary radiation into secondary radiation to the outside. For example, the radiation emitting device emits yellow light without a blue component. Compared to commercially available yellow phosphors, the present phosphor thereby comprises a significantly superior visual utility effect due to its narrow-band emission.

According to at least one embodiment of the radiation emitting device, an emission maximum of the phosphor is between 500 nm inclusive and 600 nm inclusive. The emission maximum is the wavelength $\lambda_{max}$ at which the emission curve of the phosphor reaches its maximum value. In particular, the emission maximum of the phosphor after excitation with a primary radiation in the blue spectral range is between 500 nm inclusive and 600 nm inclusive. Thus, the emission maximum of the phosphor after excitation with a primary radiation in the blue spectral range is in the yellow spectral range. In a further embodiment, the emission maximum is at a wavelength $\lambda_{max}$ of about 554 nm.

According to at least one embodiment of the radiation emitting device, a dominant wavelength ($\lambda_D$) of the phosphor is between 550 nm inclusive and 580 nm inclusive. The dominant wavelength is the wavelength of monochromatic light that produces a similar hue perception as polychromatic light mixtures. In general, the dominant wavelength differs from the emission maximum. In particular, the dominant wavelength of the phosphor after excitation with a primary radiation in the blue spectral range is between 550 nm inclusive and 580 nm inclusive. In a further embodiment, the dominant wavelength of the phosphor is about 566 nm.

According to at least one embodiment of the radiation emitting device, a spectral half-width of the emission of the phosphor is between 60 nm inclusive and 100 nm inclusive. In particular, the spectral half-width of the emission of the phosphor after excitation with a primary radiation in the blue spectral range is between 60 nm inclusive and 100 nm inclusive. In a further embodiment, the spectral half-width of the emission of the phosphor is about 85 nm. Thus, the spectral half-width of the emission is significantly narrower than that of commercially available yellow reference phosphors such as $Y_3Al_5O_{12}:Ce^{3+}$ with typically between 110 nm and 125 nm.

According to at least one embodiment, the conversion element is free of a further phosphor. "Free of a further phosphor" means that only the phosphor with the general formula $EA_2A_4D_3O_xN_{8-x}:RE$ is included in the conversion element of the radiation emitting device for wavelength conversion and results in wavelength conversion within the radiation emitting device.

According to at least one embodiment, the conversion element comprises a second phosphor that converts electromagnetic radiation of the first wavelength range to electromagnetic radiation of a third wavelength range. In particular, the second phosphor is a red emitting phosphor that converts the primary radiation into a red secondary radiation, or a green emitting phosphor that converts the primary radiation into a green secondary radiation. In particular, the second phosphor absorbs and converts blue primary radiation, in particular with a wavelength range from 400 nm inclusive to 500 nm inclusive, such as from 405 nm inclusive to 480 nm inclusive.

By using a second phosphor in combination with a phosphor of the general formula $EA_2A_4D_3O_xN_{8-x}:RE$, the color locus of the radiation emitting device can be adjusted, for example for color on demand applications or for generating biologically effective lighting for human centric lighting.

In particular, nitride phosphors can be used as red emitting phosphors, for example $Sr_2Si_5N_8$, $Ba_2Si_5N_8$, $CaAlSiN_3$, $(Ca,Sr)AlSiN_3$ or $Sr(Ca,Sr)Si_2Al_2N_6$.

By using a red emitting second phosphor in combination with a phosphor of the general formula $EA_2A_4D_3O_xN_{8-x}:RE$ in the radiation emitting device, a mixed light with a color locus in the warm white region can be generated. In particular, the mixed light with a color locus in the warm white region is generated by a combination of the blue primary radiation of the semiconductor chip, the yellow secondary radiation of the phosphor described herein, and the red secondary radiation of the red-emitting second phosphor. Thus, warm white mixed light with a high color rendering index $R_a$ can be generated.

For example, beta-SiAlON, $EA_2SiO_4$ (EA=Sr, Ba), $Lu_3(Al,Ga)_5O_{12}$, chlorosilicates such as $EA_9(SiO_4)_4Cl_{12}$ (EA=Ca, Mg, Sr, Ba) or 222-SiONe such as $SrSi_2O_2N_2$ can be used as green-emitting phosphors.

By using a green emitting second phosphor in combination with a phosphor of the general formula $EA_2A_4D_3O_xN_{8-x}:RE$ in the radiation emitting device, a mixed light with a color locus in the cold white region can be generated. In particular, the mixed light with a color locus in the cold white region is generated by a combination of the blue primary radiation of the semiconductor chip, the yellow secondary radiation of the phosphor described herein, and the green secondary radiation of the green-emitting second phosphor. Thus, cold white mixed light with a low color rendering index $R_a$ can be generated.

According to at least one embodiment, the phosphor in the conversion element is present as a ceramic or in a matrix material. A phosphor present as a ceramic is in particular largely free of a matrix material and/or a further phosphor. In a further embodiment, the ceramic formed from the phosphor comprises a low porosity. This means that undesirable light scattering can be prevented or virtually prevented and good heat dissipation takes place.

Alternatively, the phosphor is embedded in a matrix material, in particular in particle form. The matrix material comprises, for example, the above-mentioned materials for the casting. In particular, the surface of the phosphor can be passivated for embedding in a matrix material. More than one phosphor may be embedded in a matrix material. For example, particles of two phosphors are embedded in the matrix material.

BRIEF DESCRIPTION OF THE DRAWINGS

Further advantageous embodiments, configurations and developments of the phosphor, the method for producing a phosphor and the radiation emitting device result from the following exemplary embodiments shown in conjunction with the figures.

Identical, similar or similar-acting elements are shown in the figures with the same reference signs. The figures and the proportions of the elements shown in the figures with respect to one another are not to be regarded as true to scale. Rather, individual elements, in particular layer thicknesses, can be shown exaggeratedly large for better representability and/or better understanding.

DETAILED DESCRIPTION

The exemplary embodiment $Sr_2Li_4Si_3O_4N_4:Eu^{2+}$ of phosphor 1 was synthesized as follows: A stoichiometric composition of the reactants $Li_3N$, $Li_2O$, $Si_3N_4$, $SiO_2$, $Sr_3N_2$, SrO and $Eu_2O_3$ were provided and heated in a nickel crucible under 100 bar nitrogen atmosphere at 900° C. for 16 hours.

Tab. 1 below shows the crystallographic data of the exemplary embodiment $Sr_2Li_4Si_3O_4N_4:Eu^{2+}$ of phosphor 1.

For the monoclinic space group, the angles α and γ are equal to 90° and β is not equal to 90°, and the lattice parameters a, b and c differ from one another. The mixed occupation of europium and strontium was not considered in the structure refinement due to the small atomic fraction of europium.

radius of the isotropic deflection parameter of the respective atom. The position LiO3 is only half occupied. This position thus characterizes the trigonal-planar surrounded symmetrically equivalent positions for Li atoms, which are mutually exclusively occupied.

TABLE 2

| atom | Wyckoff position | x | y | z | occupation | $U_{iso}$ |
|---|---|---|---|---|---|---|
| Sr01 | 4b | 0.6821(2) | 0.35944(4) | 0.1201(2) | 1 | 0.0136(2) |
| Si02 | 2a | 0.4907(8) | 0.5 | 0.6299(7) | 1 | 0.0089(7) |
| Si03 | 4b | 0.3369(5) | 0.30886(18) | 0.4946(4) | 1 | 0.0091(5) |
| O004 | 2a | 0.568(2) | 0.5 | 0.357(2) | 1 | 0.011(2) |
| O005 | 4b | 0.196(2) | 0.3219(4) | 0.1654(12) | 1 | 0.0146(16) |
| N006 | 4b | 0.683(2) | 0.2809(4) | 0.590(2) | 1 | 0.0104(17) |
| O007 | 2a | 0.799(3) | 0.5 | 0.881(3) | 1 | 0.016(3) |
| N008 | 4b | 0.2895(16) | 0.4073(5) | 0.6440(15) | 1 | 0.0118(14) |
| Li01 | 2a | 0.983(7) | 0.5 | 0.614(6) | 1 | 0.023(6) |
| Li02 | 4b | 0.055(4) | 0.3287(13) | 0.794(4) | 1 | 0.019(4) |
| Li03 | 4b | 0.177(15) | 0.467(2) | 0.107(14) | 0.5 | 0.033(8) |

In Tab. 1, the measured section of the reciprocal space is specified by the limits of the corresponding Miller indices (hkl). Furthermore, the conventional R-value of all reflections $R_{all}$ is specified, which indicates the mean percentage deviation between observed and calculated structure factors. The weighted R-value $wR_{ref}$ contains a weighting factor that weights the reflexes according to a defined scheme inter alia depending on their standard deviation. For a good structural model, $R_{all}$ should be below 5% and $wR_{ref}$ below 10%. As a further quality feature for the agreement of calculated and measured structure, the goodness of fit (GoF) is specified, which should be close to 1.

The reliability factors and the goodness of fit factor are in the desired regions for the exemplary embodiment $Sr_2Li_4Si_3O_4N_4:Eu^{2+}$ of phosphor 1.

TABLE 1

| | |
|---|---|
| molecular formula | $Sr_2Li_4Si_3O_4N_4: Eu^{2+}$ |
| formula mass/g mol$^{-1}$ | 407.3 |
| Z | 2 |
| crystal system | monoclinic |
| space group | Cm |
| lattice parameters | |
| a/pm | 516.11(8) |
| b/pm | 1479.7(2) |
| c/pm | 541.21(9) |
| α/° | 90 |
| β/° | 111.706(9) |
| γ/° | 90 |
| volume V/nm$^3$ | 0.38401(11) |
| crystallographic density ρ/g cm$^{-3}$ | 3.523 |
| T/K | 296(2) |
| diffractometer | BRUKER D8 Quest |
| radiation | Cu K$_α$ (154.178 nm) |
| measuring range | 5.981 ≤ θ ≤ 67.946 |
| measured reflexes | 1802 |
| independent reflexes | 689 |
| measured reciprocal space | −6 ≤ h ≤ 6; −17 ≤ k ≤ 17; −6 ≤ l ≤ 6 |
| $R_{all}$ | 2.57% |
| $wR_{ref}$ | 5.38% |
| GoF | 1.033 |

Tab. 2 below shows the Wyckoff position, the atomic positions x, y and z, the occupations and the isotropic deflection parameters Uiso for atoms of the exemplary embodiment $Sr_2Li_4Si_3O_4N_4:Eu^{2+}$ of phosphor 1.

The Wyckoff position describes the symmetry of the Wyckoff positions according to R. W. G. Wyckoff. $U_{iso}$ is the FIGS. 1A-D show sections of the host lattice of an exemplary embodiment of phosphor 1 with the formula $Sr_2Li_4Si_3O_4N_4:Eu^{2+}$ in the bc plane (side view) and FIGS. 2A-D show sections of the same host lattice in the ab plane orthogonal to the bc plane (top view). In FIGS. 1A-C and 2A-C, selected atoms and bonds are not shown for ease of visualization and understanding of the structure.

Figure 1A:
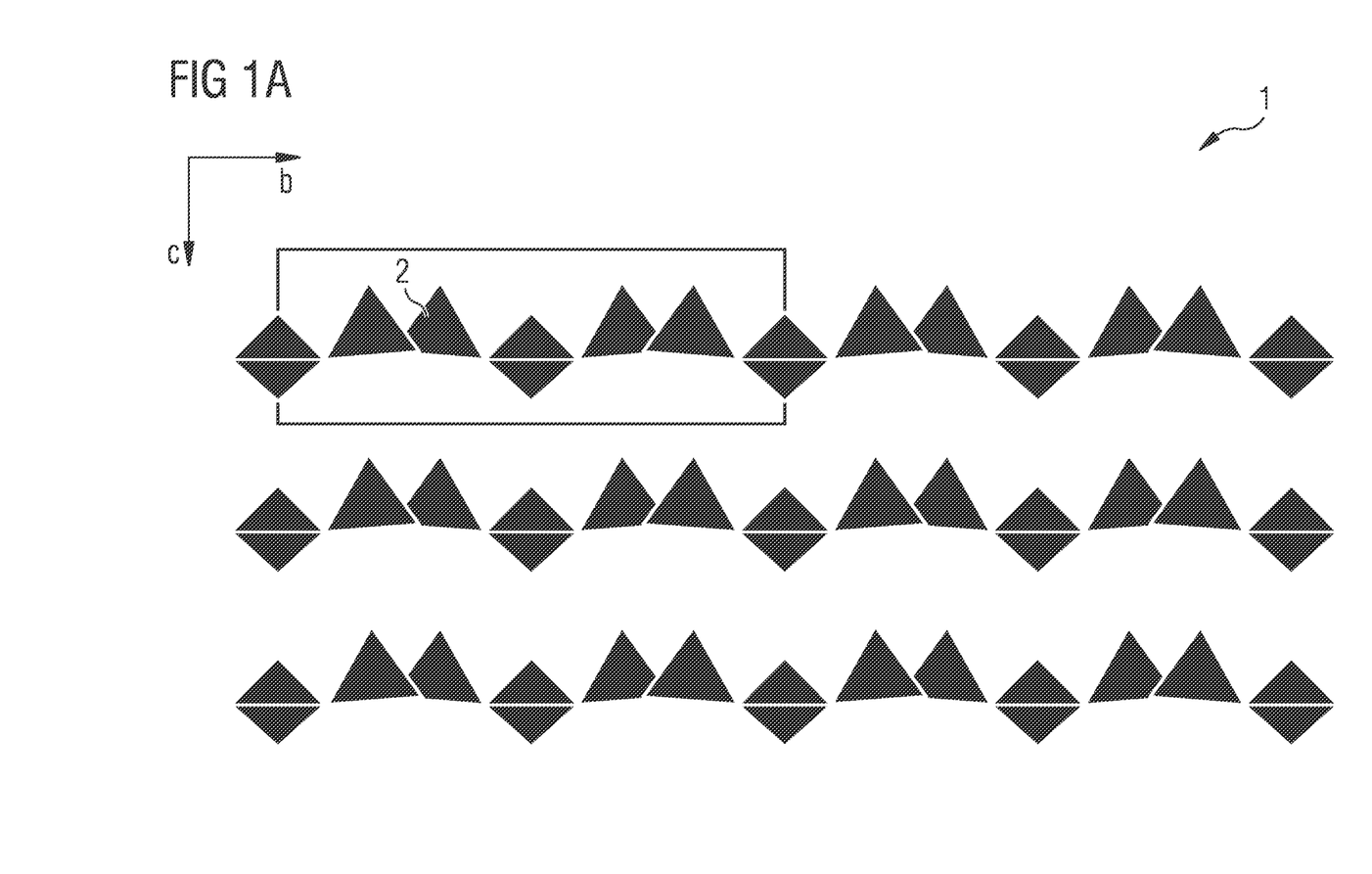
FIGS. 1A-D and 2A-D show sections from different perspectives of the host lattice of the phosphor according to an exemplary embodiment, FIGS. 3 and 4 each show a radiation emitting device according to exemplary embodiments.

FIG. 1A shows three layers of corner-linked schematically represented $Si(O,N)_4$ tetrahedra 2 arranged on top of each other. All other atoms of the host lattice of the phosphor $Sr_2Li_4Si_3O_4N_4:Eu^{2+}$ are not shown. The $Si(O,N)_4$ tetrahedra 2 within a layer are linked to each other via an oxygen atom or a nitrogen atom. The $Si(O,N)_4$ tetrahedra 2 from different layers are not directly linked to each other.

Figure 2A:
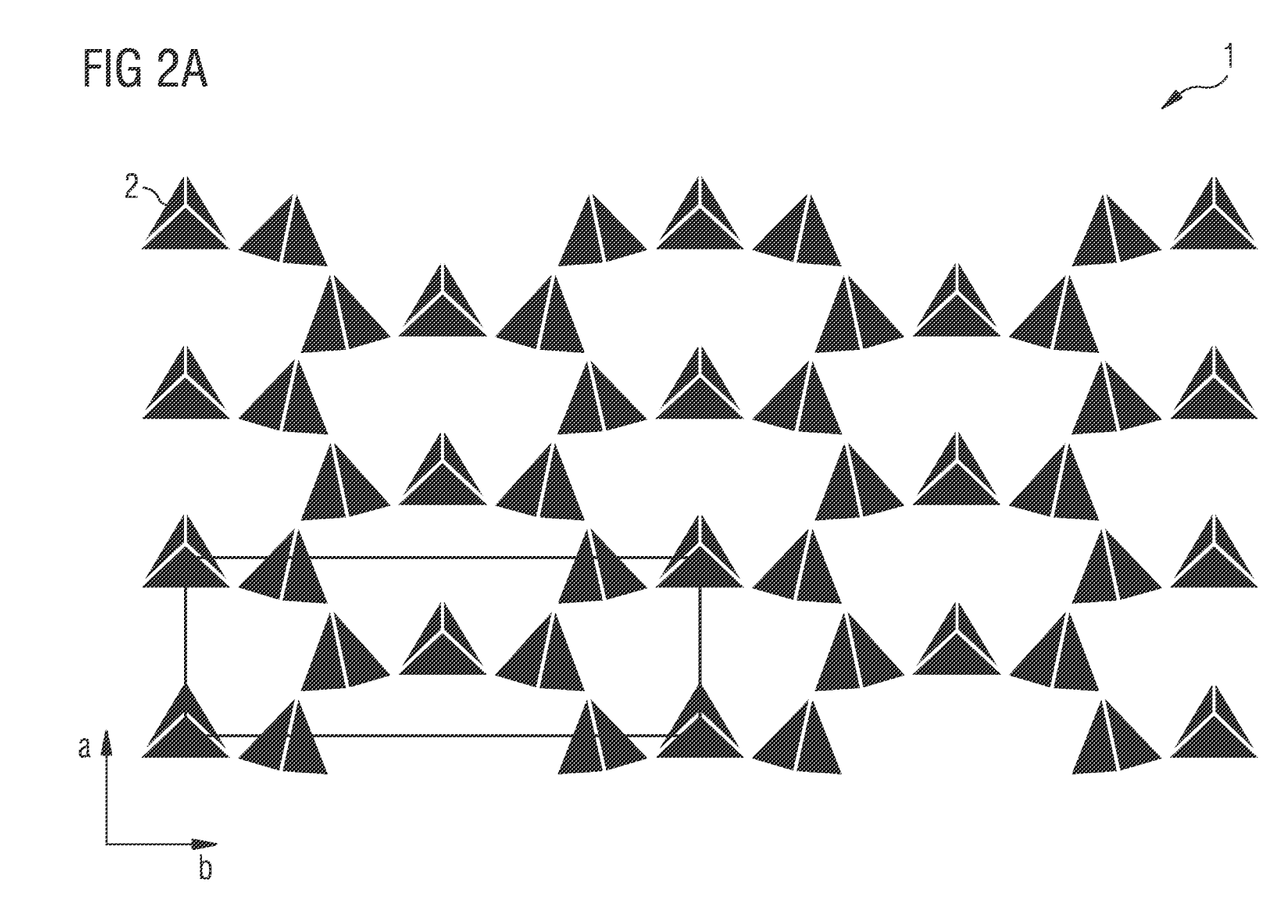

FIG. 2A shows the top view of the structure of FIG. 1A. For clarity, only one layer of corner-linked $Si(O,N)_4$ tetrahedra 2 is shown. Each $Si(O,N)_4$ tetrahedron 2 is linked within the layer with at least two further $Si(O,N)_4$ tetrahedra 2 via one corner each. Eight $Si(O,N)_4$ tetrahedra 2 each form a ring structure. The layer of corner-linked $Si(O,N)_4$ tetrahedra 2 includes at least one eight-ring structure. In particular, the layer of corner-linked $Si(O,N)_4$ tetrahedra 2 comprises a plurality of interconnected eight-ring structures.

Figure 1B:
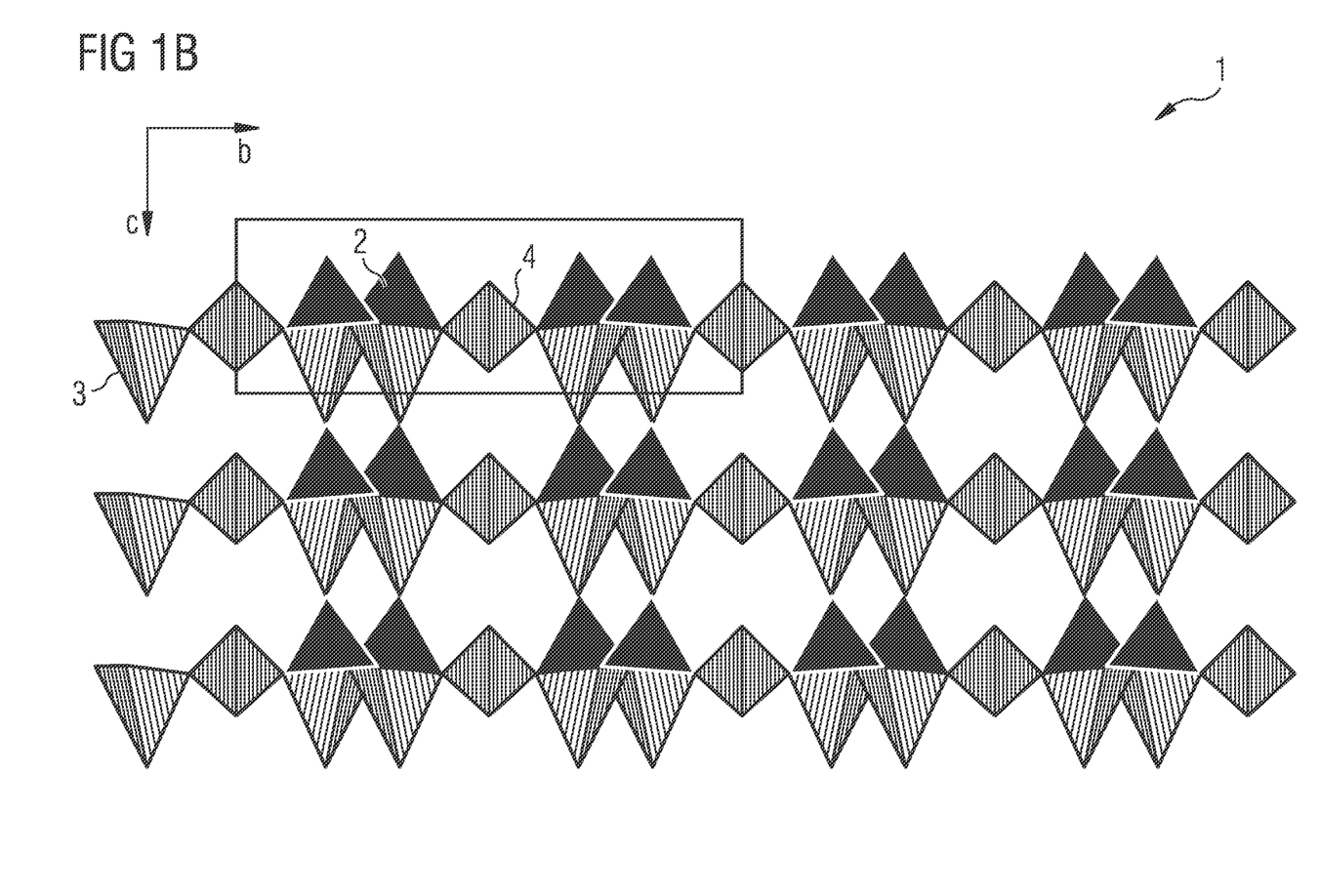

FIG. 1B shows the side view from FIG. 1A, in which $Li(O,N)_4$ tetrahedra 4 and $Li(O,N)_{3+1}$ units 3 are additionally shown. The $Si(O,N)_4$ tetrahedra 2 and the $Li(O,N)_4$ tetrahedra 4 or the $Li(O,N)_{3+1}$ units 3 are corner-linked. The $Li(O,N)_4$ tetrahedra 4 or the $Li(O,N)_{3+1}$ units 3 connect the layers of corner-linked $Si(O,N)_4$ tetrahedra 2 to each other. A $Li(O,N)_4$ tetrahedron 4 or a $Li(O,N)_{3+1}$ unit 3 may be linked with at least two $Si(O,N)_4$ tetrahedra 2 from one or two adjacent layers of corner-linked $Si(O,N)_4$ tetrahedra 2. In particular, the $Li(O,N)_{3+1}$ units 3 link the $Si(O,N)_4$ tetrahedra 2 from two adjacent layers of corner-linked $Si(O,N)_4$ tetrahedra 2 and the $Li(O,N)_4$ tetrahedra 4 link the $Si(O,N)_4$ tetrahedra 2 within one layer of corner-linked $Si(O,N)_4$ tetrahedra 2. In particular, $Si(O,N)_4$ tetrahedra 2 are only linked within their own layer via $Li(O,N)_4$ tetrahedra 4, but not with an adjacent layer.

Figure 2B:
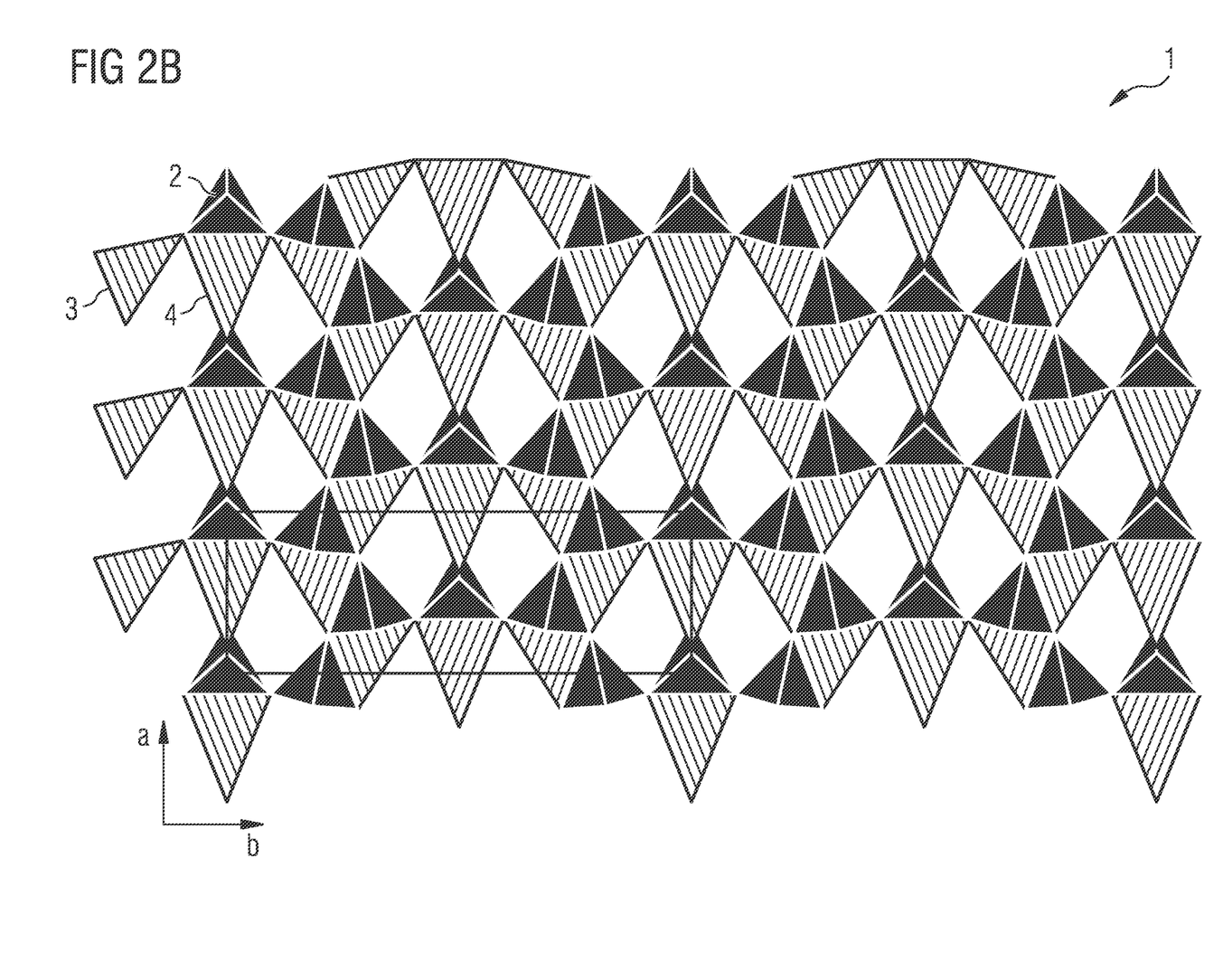

FIG. 2B shows the top view of the structure of FIG. 1B. For reasons of clarity, only one layer of corner-linked $Si(O,N)_4$ tetrahedra 2 and only $Li(O,N)_4$ tetrahedra 4 and $Li(O,N)_{3+1}$ units 3 linking downward and within the layer are shown.

Figure 1C:
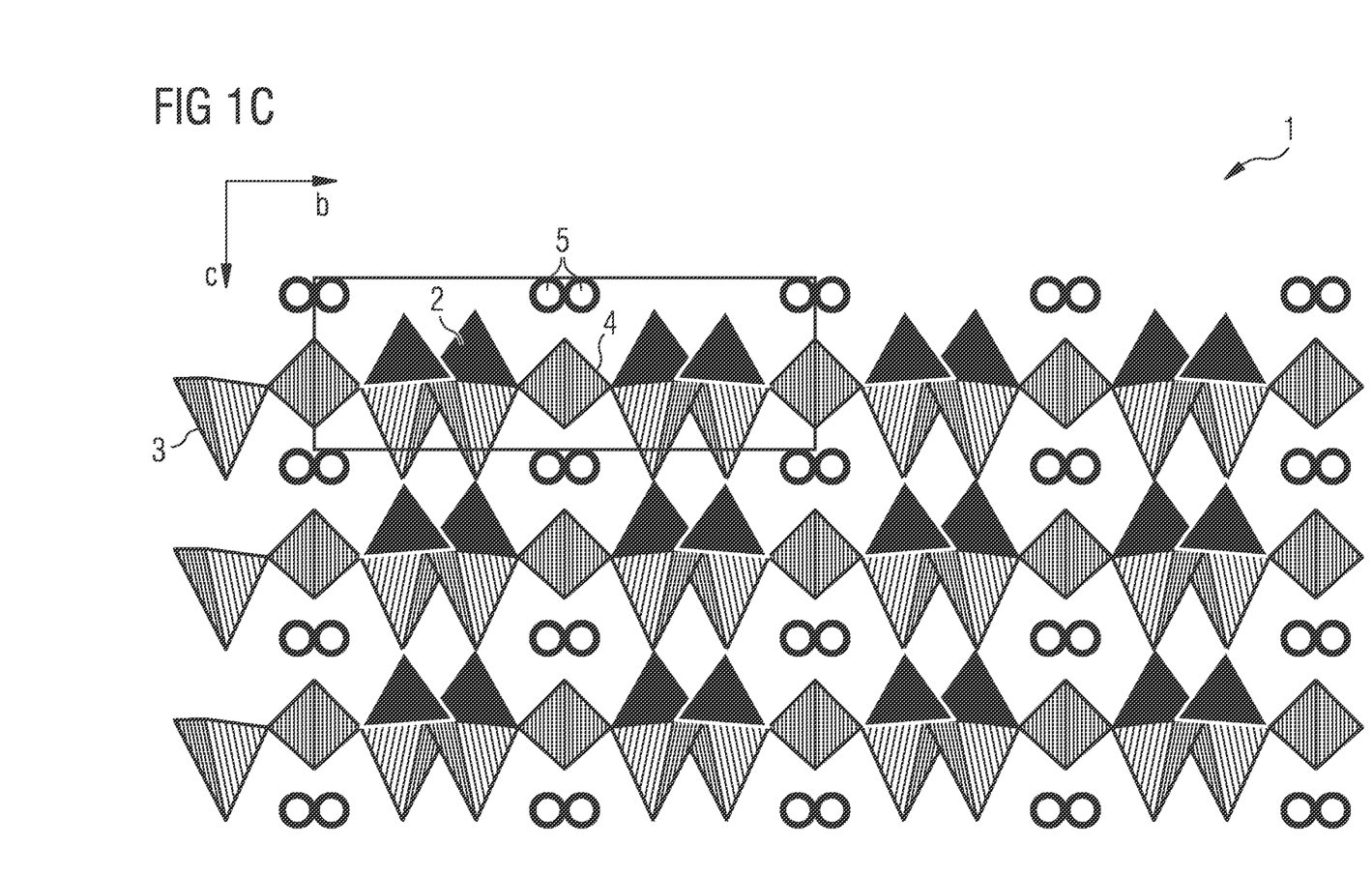
Figure 2C:
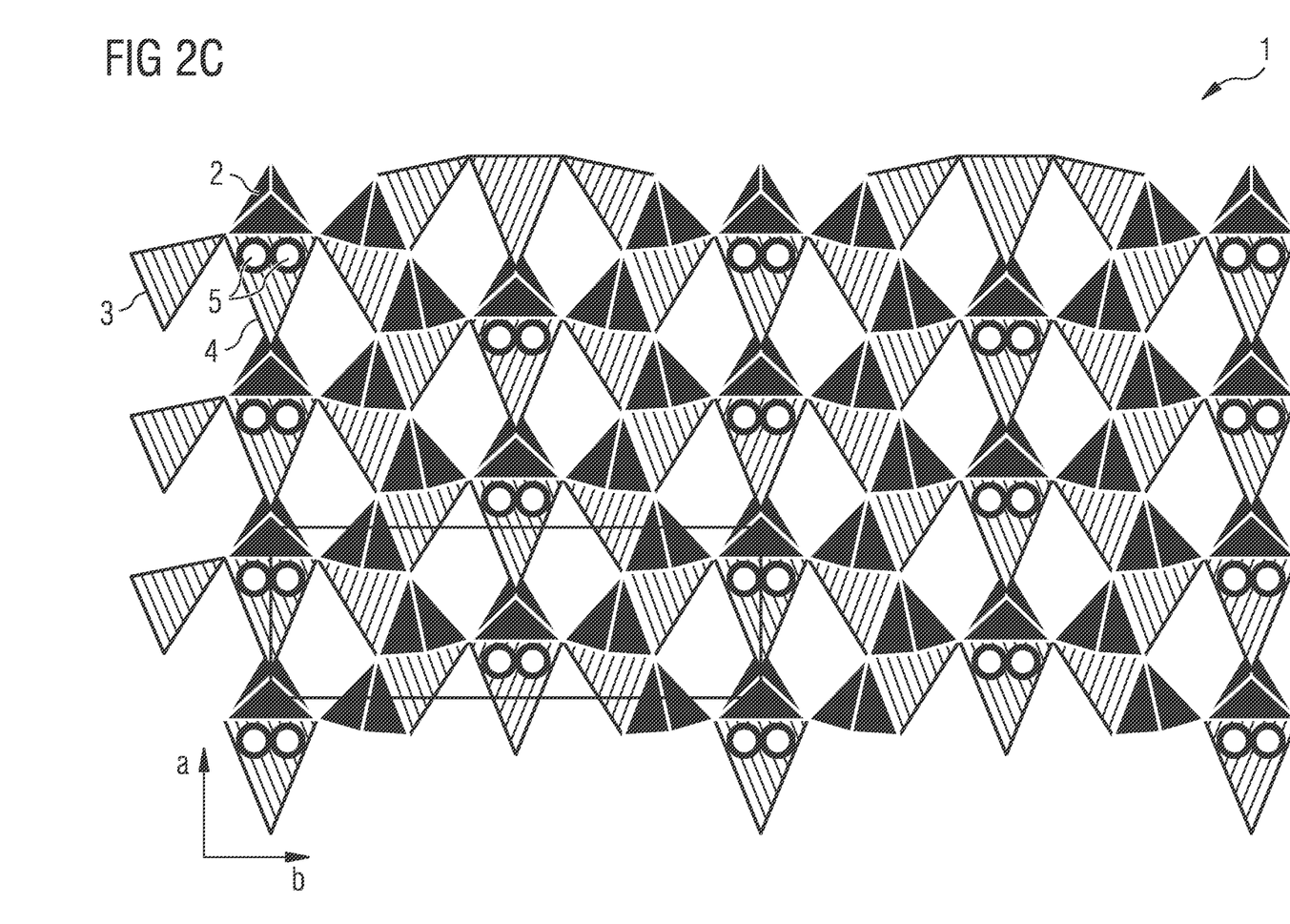

FIG. 1C shows the side view from FIG. 1B, in which the two symmetrically equivalent positions 5 for the Li atom of the Li(O,N)$_3$ units are additionally shown. FIG. 2C shows the top view of the structure of FIG. 1C. The occupation of the symmetrically equivalent positions 5 with a Li atom is mutually exclusive. Thus, only one of the two symmetrically equivalent positions 5 is always occupied with a Li atom. The Li(O,N)$_3$ units are arranged between the layers of corner-linked D(O,N)$_4$ tetrahedra 2 and link two adjacent layers together.

Figure 1D:
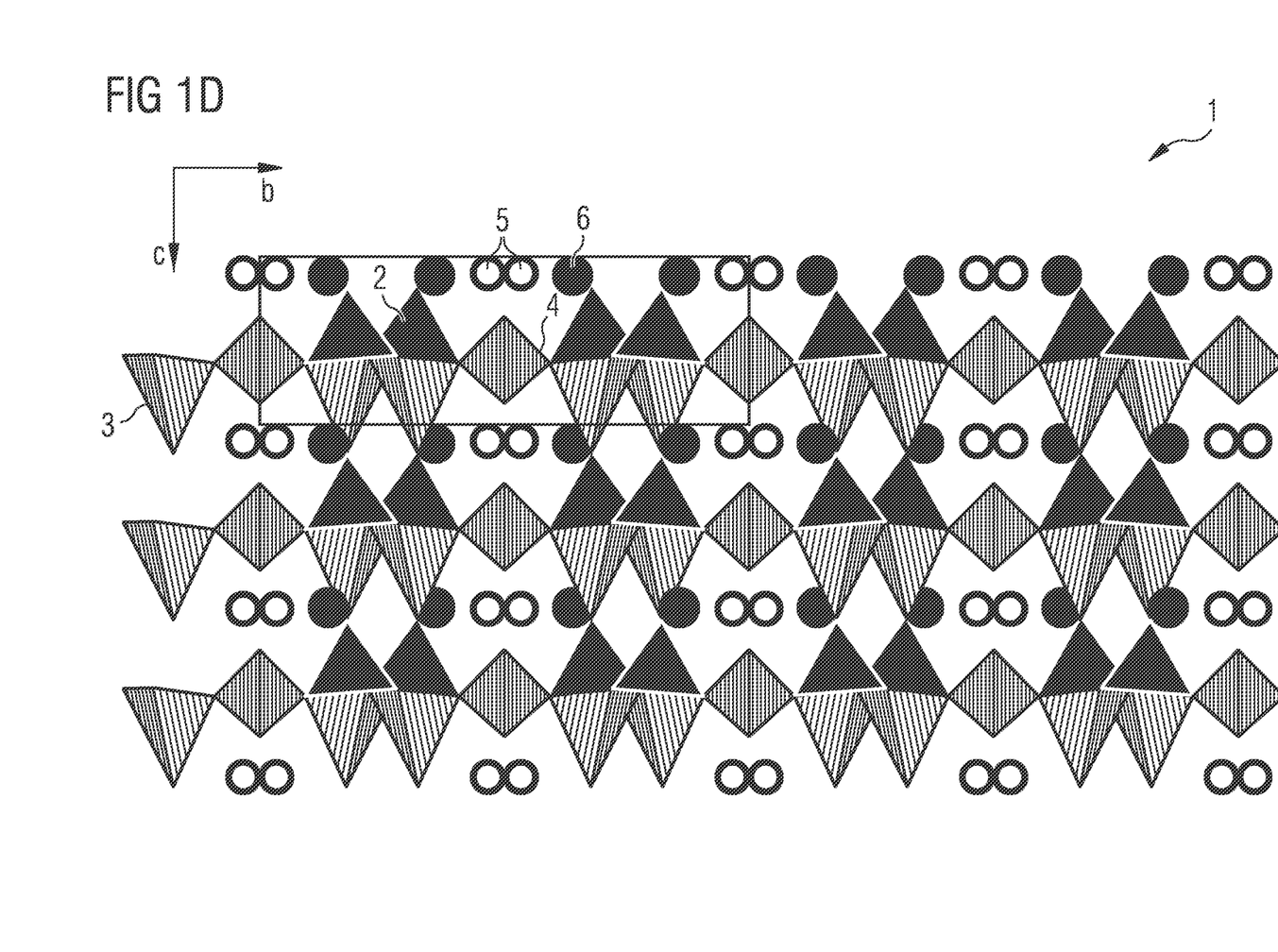
Figure 2D:
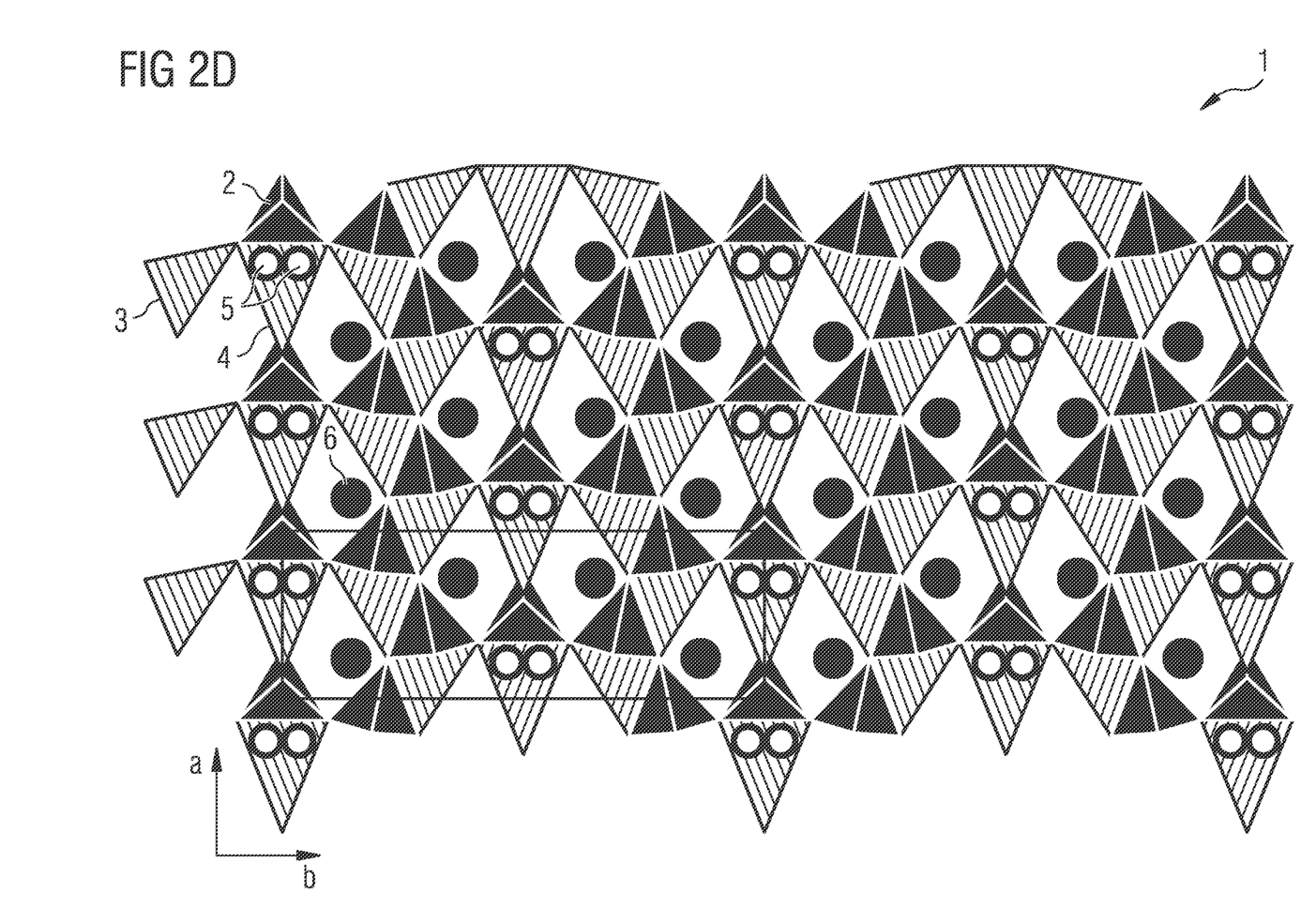

FIG. 1D shows the side view from FIG. 1C, in which the Sr atoms 6 are additionally shown. FIG. 2D shows the top view of the structure of FIG. 1D. The Sr atoms 6 are arranged in interstitial spaces between the Li(O,N)$_4$ tetrahedra 4 and/or the Li(O,N)$_{3+1}$ units 3 and/or the Li(O,N)$_3$ units linking the layers of corner-linked Si(O,N)$_4$ tetrahedra 2. In particular, the Sr atoms 6 are arranged between the layers of corner-linked Si(O,N)$_4$ tetrahedra 2. Part of the Sr atoms 6 may be replaced by Eu$^{2+}$ ions. In particular, the molecular fraction of Eu$^{2+}$ relative to Sr may be between 0.001 inclusive and 0.1 inclusive.

Further exemplary embodiments of phosphor 1 are shown in Table 3.

TABLE 3 exemplary embodiments of phosphor 1

| no. | molecular formula |
|---|---|
| 1 | Sr$_2$Li$_4$Si$_3$O$_4$N$_4$: Eu$^{2+}$ |
| 2 | Ca$_2$Li$_4$Si$_3$O$_4$N$_4$: Eu$^{2+}$ |
| 3 | Ba$_2$Li$_4$Si$_3$O$_4$N$_4$: Eu$^{2+}$ |
| 4 | Sr$_2$Li$_4$Zr$_3$O$_4$N$_4$: Eu$^{2+}$ |
| 5 | Ca$_2$Li$_4$Zr$_3$O$_4$N$_4$: Eu$^{2+}$ |
| 6 | Ba$_2$Li$_4$Zr$_3$O$_4$N$_4$: Eu$^{2+}$ |
| 7 | Sr$_2$Li$_4$Hf$_3$O$_4$N$_4$: Eu$^{2+}$ |
| 8 | Ca$_2$Li$_4$Hf$_3$O$_4$N$_4$: Eu$^{2+}$ |
| 9 | Ba$_2$Li$_4$Hf$_3$O$_4$N$_4$: Eu$^{2+}$ |
| 10 | Sr$_2$Mg$_4$Si$_3$N$_8$: Eu$^{2+}$ |
| 11 | Sr$_2$(Mg$_3$Li)Al$_3$O$_4$N$_4$: Eu$^{2+}$ |
| 12 | Sr$_2$Li$_4$Al$_3$O$_7$N: Eu$^{2+}$ |
| 13 | Ca$_2$Mg$_4$Si$_3$N$_8$: Eu$^{2+}$ |
| 14 | Ca$_2$(Mg$_3$Li)Al$_3$O$_4$N$_4$: Eu$^{2+}$ |
| 15 | Ca$_2$Li$_4$Al$_3$O$_7$N: Eu$^{2+}$ |
| 16 | Ba$_2$Mg$_4$Si$_3$N$_8$: Eu$^{2+}$ |
| 17 | Ba$_2$(Mg$_3$Li)Al$_3$O$_4$N$_4$: Eu$^{2+}$ |
| 18 | Ba$_2$Li$_4$Al$_3$O$_7$N: Eu$^{2+}$ |
| 19 | Sr$_2$Li$_4$Ge$_3$O$_4$N$_4$: Eu$^{2+}$ |
| 20 | Ca$_2$Li$_4$Ge$_3$O$_4$N$_4$: Eu$^{2+}$ |
| 21 | Ba$_2$Li$_4$Ge$_3$O$_4$N$_4$: Eu$^{2+}$ |
| 22 | Sr$_2$Mg$_4$Ge$_3$N$_8$: Eu$^{2+}$ |
| 23 | Sr$_2$(Mg$_3$Li)Ga$_3$O$_4$N$_4$: Eu$^{2+}$ |
| 24 | Sr$_2$Li$_4$Ga$_3$O$_7$N: Eu$^{2+}$ |
| 25 | Ca$_2$Mg$_4$Ge$_3$N$_8$: Eu$^{2+}$ |
| 26 | Ca$_2$(Mg$_3$Li)Ga$_3$O$_4$N$_4$: Eu$^{2+}$ |
| 27 | Ca$_2$Li$_4$Ga$_3$O$_7$N: Eu$^{2+}$ |
| 28 | Ba$_2$Mg$_4$Ge$_3$N$_8$: Eu$^{2+}$ |
| 29 | Ba$_2$(Mg$_3$Li)Ga$_3$O$_4$N$_4$: Eu$^{2+}$ |
| 30 | Ba$_2$Li$_4$Ga$_3$O$_7$N: Eu$^{2+}$ |
| 31 | Sr$_2$(Mg$_3$Li)Si$_3$ON$_7$: Eu$^{2+}$ |
| 32 | Ca$_2$(Mg$_3$Li)Si$_3$ON$_7$: Eu$^{2+}$ |
| 33 | Ba$_2$(Mg$_3$Li)Si$_3$ON$_7$: Eu$^{2+}$ |
| 34 | Sr$_2$Li$_4$Si$_3$O$_4$N$_4$: Ce$^{2+}$ |
| 35 | Ca$_2$Li$_4$Si$_3$O$_4$N$_4$: Ce$^{2+}$ |
| 36 | Ba$_2$Li$_4$Si$_3$O$_4$N$_4$: Ce$^{2+}$ |
| 37 | Sr$_2$Li$_4$Zr$_3$O$_4$N$_4$: Ce$^{2+}$ |
| 38 | Ca$_2$Li$_4$Zr$_3$O$_4$N$_4$: Ce$^{2+}$ |
| 39 | Ba$_2$Li$_4$Zr$_3$O$_4$N$_4$: Ce$^{2+}$ |
| 40 | Sr$_2$Li$_4$Hf$_3$O$_4$N$_4$: Ce$^{2+}$ |
| 41 | Ca$_2$Li$_4$Hf$_3$O$_4$N$_4$: Ce$^{2+}$ |
| 42 | Ba$_2$Li$_4$Hf$_3$O$_4$N$_4$: Ce$^{2+}$ |
| 43 | Sr$_2$Mg$_4$Si$_3$N$_8$: Ce$^{2+}$ |
| 44 | Sr$_2$(Mg$_3$Li)Al$_3$O$_4$N$_4$: Ce$^{2+}$ |
| 45 | Sr$_2$Li$_4$Al$_3$O$_7$N: Ce$^{2+}$ |
| 46 | Ca$_2$Mg$_4$Si$_3$N$_8$: Ce$^{2+}$ |

TABLE 3-continued exemplary embodiments of phosphor 1

| no. | molecular formula |
|---|---|
| 47 | Ca$_2$(Mg$_3$Li)Al$_3$O$_4$N$_4$: Ce$^{2+}$ |
| 48 | Ca$_2$Li$_4$Al$_3$O$_7$N: Ce$^{2+}$ |
| 49 | Ba$_2$Mg$_4$Si$_3$N$_8$: Ce$^{2+}$ |
| 50 | Ba$_2$(Mg$_3$Li)Al$_3$O$_4$N$_4$: Ce$^{2+}$ |
| 51 | Ba$_2$Li$_4$Al$_3$O$_7$N: Ce$^{2+}$ |
| 52 | Sr$_2$Li$_4$Ge$_3$O$_4$N$_4$: Ce$^{2+}$ |
| 53 | Ca$_2$Li$_4$Ge$_3$O$_4$N$_4$: Ce$^{2+}$ |
| 54 | Ba$_2$Li$_4$Ge$_3$O$_4$N$_4$: Ce$^{2+}$ |
| 55 | Sr$_2$Mg$_4$Ge$_3$N$_8$: Ce$^{2+}$ |
| 56 | Sr$_2$(Mg$_3$Li)Ga$_3$O$_4$N$_4$: Ce$^{2+}$ |
| 57 | Sr$_2$Li$_4$Ga$_3$O$_7$N: Ce$^{2+}$ |
| 58 | Ca$_2$Mg$_4$Ge$_3$N$_8$: Ce$^{2+}$ |
| 59 | Ca$_2$(Mg$_3$Li)Ga$_3$O$_4$N$_4$: Ce$^{2+}$ |
| 60 | Ca$_2$Li$_4$Ga$_3$O$_7$N: Ce$^{2+}$ |
| 61 | Ba$_2$Mg$_4$Ge$_3$N$_8$: Ce$^{2+}$ |
| 62 | Ba$_2$(Mg$_3$Li)Ga$_3$O$_4$N$_4$: Ce$^{2+}$ |
| 63 | Ba$_2$Li$_4$Ga$_3$O$_7$N: Ce$^{2+}$ |
| 64 | Sr$_2$(Mg$_3$Li)Si$_3$ON$_7$: Ce$^{2+}$ |
| 65 | Ca$_2$(Mg$_3$Li)Si$_3$ON$_7$: Ce$^{2+}$ |
| 66 | Ba$_2$(Mg$_3$Li)Si$_3$ON$_7$: Ce$^{2+}$ |

Further exemplary embodiments of phosphor 1 are the mixed crystal series between the end phases listed in Tab. 3. Selected examples are shown in Tab. 4.

TABLE 4 exemplary embodiments of phosphor 1

| no. | |
|---|---|
| 67 | Sr$_{1-\alpha}$Ca$_\alpha$)$_2$Li$_4$Si$_3$O$_4$N$_4$: Eu$^{2+}$, $\alpha$ = 0-1 |
| 68 | (Sr$_{1-\alpha}$Ba$_\alpha$)$_2$Li$_4$Si$_3$O$_4$N$_4$: Eu$^{2+}$, $\alpha$ = 0-1 |
| 69 | (Ca$_{1-\alpha}$Ba$_\alpha$)$_2$Li$_4$Si$_3$O$_4$N$_4$: Eu$^{2+}$, $\alpha$ = 0-1 |
| 70 | Sr$_2$(Mg$_\alpha$Li$_{4-\alpha}$)Si$_3$O$_{4-\alpha}$N$_{4+\alpha}$: Eu$^{2+}$, $\alpha$ = 0-4 |
| 71 | Ca$_2$(Mg$_\alpha$Li$_{4-\alpha}$)Si$_3$O$_{4-\alpha}$N$_{4+\alpha}$: Eu$^{2+}$, $\alpha$ = 0-4 |
| 72 | Ba$_2$(Mg$_\alpha$Li$_{4-\alpha}$)Si$_3$O$_{4-\alpha}$N$_{4+\alpha}$: Eu$^{2+}$, $\alpha$ = 0-4 |
| 73 | Sr$_2$(Mg$_\alpha$Li$_{4-\alpha}$)Si$_{3-\alpha}$Al$_\alpha$O$_4$N$_4$: Eu$^{2+}$, $\alpha$ = 0-3 |
| 74 | Ca$_2$(Mg$_\alpha$Li$_{4-\alpha}$)Si$_{3-\alpha}$Al$_\alpha$O$_4$N$_4$: Eu$^{2+}$, $\alpha$ = 0-3 |
| 75 | Ba$_2$(Mg$_\alpha$Li$_{4-\alpha}$)Si$_{3-\alpha}$Al$_\alpha$O$_4$N$_4$: Eu$^{2+}$, $\alpha$ = 0-3 |
| 76 | Sr$_{1-\alpha}$Ca$_\alpha$)$_2$Li$_4$Si$_3$O$_4$N$_4$: Ce$^{2+}$, $\alpha$ = 0-1 |
| 77 | (Sr$_{1-\alpha}$Ba$_\alpha$)$_2$Li$_4$Si$_3$O$_4$N$_4$: Ce$^{2+}$, $\alpha$ = 0-1 |
| 78 | (Ca$_{1-\alpha}$Ba$_\alpha$)$_2$Li$_4$Si$_3$O$_4$N$_4$: Ce$^{2+}$, $\alpha$ = 0-1 |
| 79 | Sr$_2$(Mg$_\alpha$Li$_{4-\alpha}$)Si$_3$O$_{4-\alpha}$N$_{4+\alpha}$: Ce$^{2+}$, $\alpha$ = 0-4 |
| 80 | Ca$_2$(Mg$_\alpha$Li$_{4-\alpha}$)Si$_3$O$_{4-\alpha}$N$_{4+\alpha}$: Ce$^{2+}$, $\alpha$ = 0-4 |
| 81 | Ba$_2$(Mg$_\alpha$Li$_{4-\alpha}$)Si$_3$O$_{4-\alpha}$N$_{4+\alpha}$: Ce$^{2+}$, $\alpha$ = 0-4 |
| 82 | Sr$_2$(Mg$_\alpha$Li$_{4-\alpha}$)Si$_{3-\alpha}$Al$_\alpha$O$_4$N$_4$: Ce$^{2+}$, $\alpha$ = 0-3 |
| 83 | Ca$_2$(Mg$_\alpha$Li$_{4-\alpha}$)Si$_{3-\alpha}$Al$_\alpha$O$_4$N$_4$: Ce$^{2+}$, $\alpha$ = 0-3 |
| 84 | Ba$_2$(Mg$_\alpha$Li$_{4-\alpha}$)Si$_{3-\alpha}$Al$_\alpha$O$_4$N$_4$: Ce$^{2+}$, $\alpha$ = 0-3 |

Figure 3:
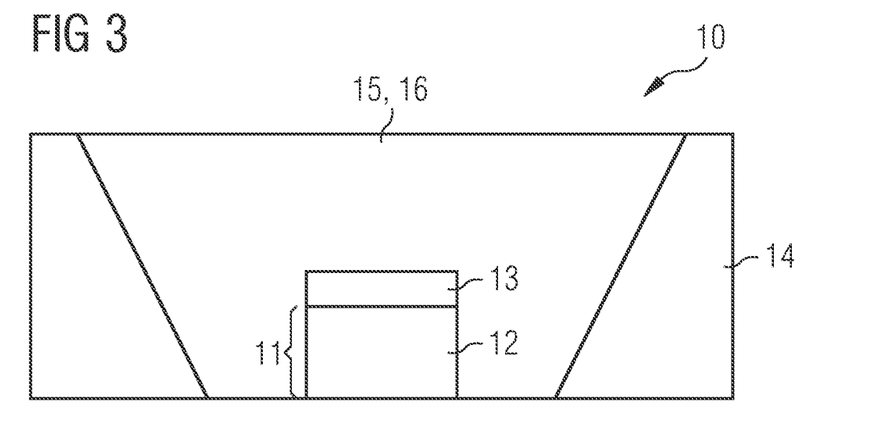

FIG. 3 shows a schematic cross-sectional view of a radiation emitting device 10 according to an exemplary embodiment comprising a semiconductor chip 11 that emits primary radiation during operation of the radiation emitting device. The semiconductor chip 11 includes an active layer sequence and an active region (not explicitly shown here) for generating the primary radiation. The primary radiation is electromagnetic radiation of a first wavelength range. In a further embodiment, the primary radiation is electromagnetic radiation with wavelengths in the visible region, for example, the blue region. The primary radiation is emitted through the radiation exit surface 12. A beam path is thereby generated or the primary radiation follows a beam path.

A conversion element 13 is arranged in the beam path of the primary radiation emitted by the semiconductor chip 11. The conversion element 13 is configured to absorb the primary radiation and to convert it at least partially into a secondary radiation with a second wavelength range. In particular, the secondary radiation comprises a longer wavelength than the absorbed primary radiation.

The conversion element 13 comprises a phosphor 1 with the general formula $EA_2A_4D_3O_xN_{8-x}$:RE. In particular, the conversion element 13 may comprise the phosphor 1 with the formula $Sr_2Li_4Si_3O_4N_4$:$Eu^{2+}$. The phosphor 1 can be embedded in a matrix material. For example, the matrix material is a silicone, a polysiloxane, an epoxy resin, or glass. Alternatively, the conversion element 13 may be free of a matrix material. In this case, the conversion element 13 can be made of the phosphor 1, for example, a ceramic of the phosphor 1.

In particular, the conversion element 13 is free of a further phosphor. If the conversion element 13 converts only a portion of the primary radiation and transmits the remaining portion of the primary radiation, the combination of transmitted blue primary radiation and converted yellow secondary radiation can produce cold white mixed light with a low color rendering index $R_a$. Alternatively, the conversion element 13 does not transmit the primary radiation, but converts the primary radiation almost completely into secondary radiation. As a result, the conversion element 13 emits secondary radiation in the yellow or yellow-green spectral range without a blue component.

Alternatively, the conversion element 13 may comprise a second phosphor that converts the primary radiation into, for example, red secondary radiation. By combining the blue primary radiation, the yellow secondary radiation and the red secondary radiation, warm white mixed light can be produced.

In the exemplary embodiment shown in FIG. 3, the semiconductor chip 11 and the conversion element 13 are embedded in a recess 15 of a housing 14. For better stabilization and protection of the semiconductor chip 11 and the conversion element 13, the recess 15 of the housing 14 can be filled with a casting 16. In particular, the recess 15 is completely filled with the casting 16 and the semiconductor chip 11 and the conversion element 13 are completely surrounded by the casting 16.

The conversion element 13 can be arranged in direct mechanical contact on the semiconductor chip 11 as shown in FIG. 3. In particular, the radiation exit surface 12 forms the common surface between the conversion element 13 and the semiconductor chip 11. Alternatively, other layers such as adhesive layers may be located between the semiconductor chip 11 and the conversion element 13.

Figure 4:
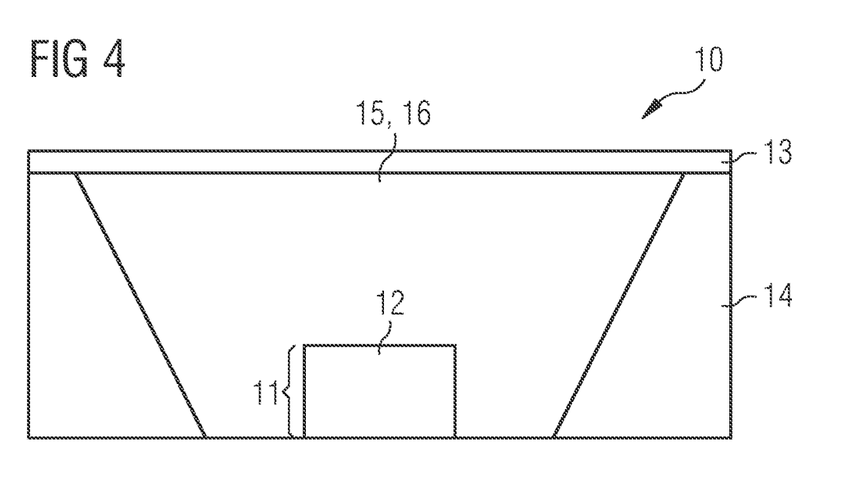

According to the exemplary embodiment shown in FIG. 4, the conversion element 13 is arranged with a distance from the semiconductor chip 11. In this case, a casting 16 may be arranged between the semiconductor chip 11 and the conversion element 13. Alternatively, the recess 15 between the semiconductor chip and the conversion element may be free of any casting or further layers or components.

Figure 5:
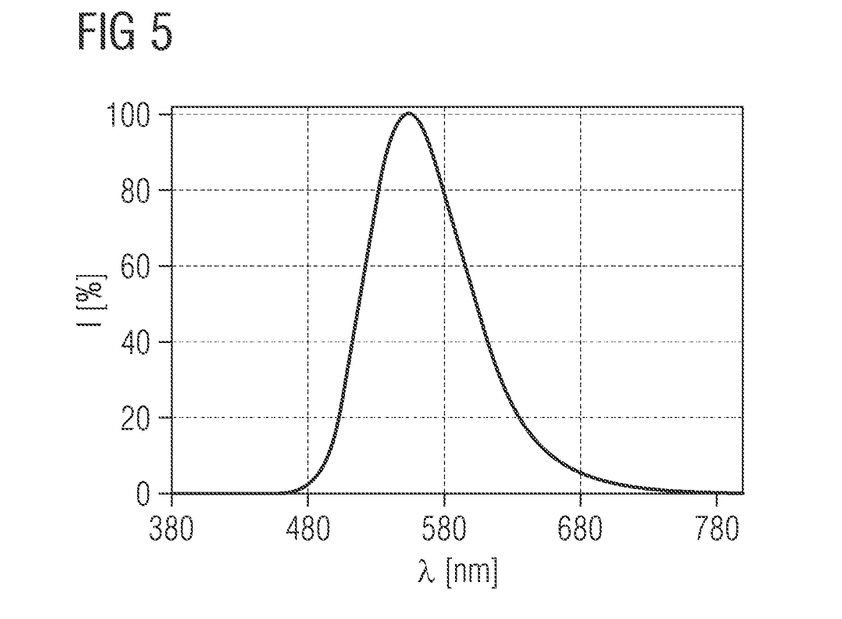
FIG. 5 shows an emission spectrum of the phosphor according to an exemplary embodiment.

FIG. 5 shows an emission spectrum of the exemplary embodiment $Sr_2Li_4Si_3O_4N_4$:$Eu^{2+}$ of phosphor 1 after excitation with blue primary radiation with a wavelength of 448 nm. The relative intensity I in percent is plotted against the wavelength $\lambda$ in nm. The emission spectrum shows a narrow-band emission in the yellow wavelength range with a dominant wavelength $\lambda_D$ of 566 nm and an emission maximum of 554 nm. The spectral half-width of the emission is 85 nm.

Figure 6:
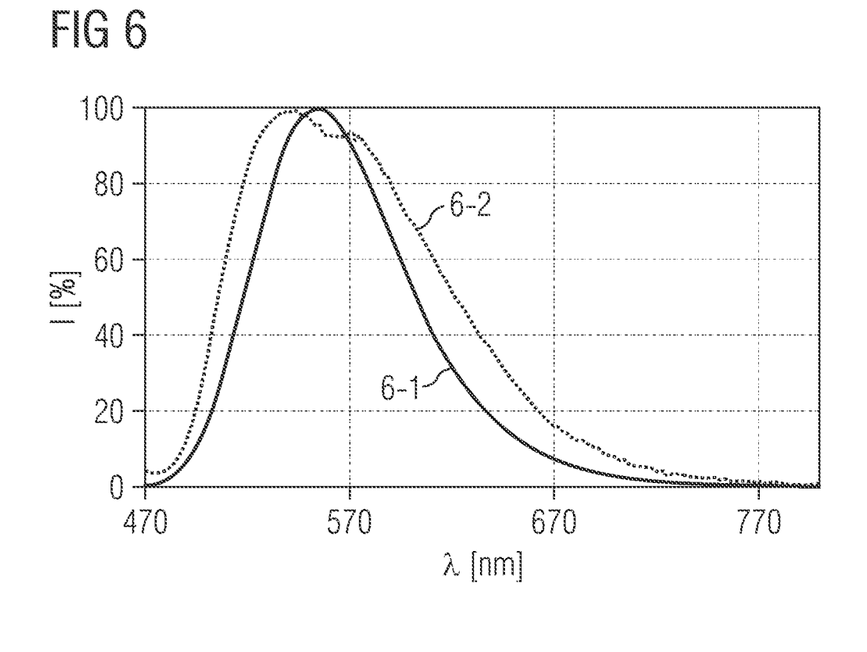
FIG. 6 shows an emission spectrum of the phosphor according to an exemplary embodiment and a comparative example.

FIG. 6 shows the emission spectra of phosphor 1 according to the exemplary embodiment with the formula $Sr_2Li_4Si_3O_4N_4$:$Eu^{2+}$ (6-1) and a comparative example (6-2), a commercial garnet phosphor of the type $Y_3Al_5O_{12}$:$Ce^{3+}$. The relative intensity I in percent is plotted against the wavelength $\lambda$ in nm. The $Y_3Al_5O_{12}$:$Ce^{3+}$ type garnet phosphor emits in the yellow spectral range and comprises a comparable color impression measured by the dominant wavelength $\lambda_D$. Tab. 3 below compares the visual properties of phosphor 1 and the comparative example.

TABLE 3

| phosphor | $\lambda_D$ | spectral half-width | $\dfrac{\eta_V(\text{phosphor})}{\eta_V(Y_3Al_5O_{12}:Ce^{3+})}$ |
|---|---|---|---|
| $Y_3Al_5O_{12}$:$Ce^{3+}$ | 567 nm | 116 nm | 100% |
| $Sr_2Li_4Si_3O_4N_4$:$Eu^{2+}$ | 566 nm | 85 nm | 114% |

At a comparable dominant wavelength $\lambda_D$, the phosphor $Sr_2Li_4Si_3O_4N_4$:$Eu^{2+}$ comprises a significantly smaller spectral half-width with 85 nm than the comparative example $Y_3Al_5O_{12}$:$Ce^{3+}$ with 116 nm. This smaller spectral half-width results in a significantly increased luminous efficacy, as shown in Tab. 3 based on the relative luminous efficacy $$\frac{\eta_V(\text{phosphor})}{\eta_V(Y_3Al_5O_{12}:Ce^{3+})}.$$

The relative luminous efficacy increased by about 14% for the phosphor $Sr_2Li_4Si_3O_4N_4$:$Eu^{2+}$ is directly beneficial for conversion applications. When used as a single phosphor, this increased luminous efficacy is equivalent to the efficiency gain of the conversion solution when using the $Sr_2Li_4Si_3O_4N_4$:$Eu^{2+}$ phosphor instead of the conventional $Y_3Al_5O_{12}$:$Ce^{3+}$ type garnet phosphor. Efficiency gains can also be achieved when using the $Sr_2Li_4Si_3O_4N_4$:$Eu^{2+}$ phosphor in a conversion solution with multiple phosphors, for example in white-emitting light-emitting diodes.

The features and exemplary embodiments described in conjunction with the figures can be combined with each other according to further exemplary embodiments, even if not all combinations are explicitly described. Furthermore, the exemplary embodiments described in conjunction with the figures may alternatively or additionally comprise further features according to the description in the general part.

The invention is not limited to the exemplary embodiments by the description based thereon. Rather, the invention encompasses any new feature as well as any combination of features, which in particular includes any combination of features in the patent claims, even if this feature or combination itself is not explicitly specified in the patent claims or exemplary embodiments.

The present patent application claims priority of German patent application DE 10 2019 122 063.7, the disclosure content of which is hereby incorporated by reference.

REFERENCES

1 Phosphor
2 Si(O,N)$_4$ tetraeder
3 Li(O,N)$_{3+1}$ unit
4 Li(O,N)$_4$ tetraeder
5 symmetrically equivalent positions
6 Sr atom
10 radiation emitting device
11 semiconductor chip
12 radiation emitting area
13 conversion element
14 housing
15 recess
16 casting

The invention claimed is:

1. A phosphor with the general formula $EA_2A_4D_3O_xN_{8-x}$:RE, wherein:
    EA is selected from the group of divalent elements;
    A is selected from the group consisting of monovalent elements, divalent elements, or trivalent elements;
    D is selected from the group consisting of trivalent elements or tetravalent elements;
    RE is an activator element;
    $0 \leq x \leq 8$; and
    $\varepsilon(4+4y+3z)=3(8-x)+2x$ with the charge number y of element A, the charge number z of element D, and $\varepsilon=0.9-1.1$.

2. The phosphor according to claim 1, wherein a host lattice of the phosphor comprises a structure with a monoclinic space group.

3. The phosphor according to claim 1, wherein the phosphor comprises a host lattice comprising D centered $D(O,N)_4$ tetrahedra, A centered $A(O,N)_4$ tetrahedra, $A(O,N)_{3+1}$ units, and $A(O,N)_3$ units.

4. The phosphor according to claim 3, wherein the host lattice comprises layers of corner-linked $D(O,N)_4$ tetrahedra, and the corner-linked $D(O,N)_4$ tetrahedra form eight-ring structures within the layers.

5. The phosphor according to claim 4, wherein the layers of corner-linked $D(O,N)_4$ tetrahedra are linked via $A(O,N)_4$ tetrahedra and/or $A(O,N)_{3+1}$ units and/or $A(O,N)_3$ units.

6. The phosphor according to claim 5, wherein the $A(O,N)_4$ tetrahedra and/or the $A(O,N)_{3+1}$ units and/or the $A(O,N)_3$ units linking the layers of corner-linked $D(O,N)_4$ tetrahedra form interstitial spaces, wherein at least one interstitial space contains an EA atom.

7. The phosphor according to claim 1, wherein EA is selected from the group consisting of Mg, Ca, Sr, Ba, or combinations thereof.

8. The phosphor according to claim 1, wherein A is selected from the group consisting of Li, Mg, Al, or combinations thereof.

9. The phosphor according to claim 1, wherein D is selected from the group consisting of Si, Al, or combinations thereof.

10. The phosphor according to claim 1, wherein RE is selected from the group consisting of rare earth metals.

11. The phosphor according to claim 1, wherein RE comprises Eu or Ce.

12. The phosphor according to claim 1, wherein the activator element comprises a molecular fraction ranging from 0.001 inclusive to 0.1 inclusive relative to EA.

13. The phosphor according to claim 1, wherein the phosphor comprises the formula $Sr_2Li_4Si_3O_4N_4$:RE.

14. A method for producing a phosphor with the general formula $EA_2A_4D_3O_xN_{8-x}$:RE, wherein:
    EA is selected from the group consisting of divalent elements;
    A is selected from the group consisting of monovalent elements, divalent elements, or trivalent elements;
    D is selected from the group consisting of trivalent elements or tetravalent elements;
    RE is an activator element;
    $0 \leq x \leq 8$; and
    $\varepsilon(4+4y+3z)=3(8-x)+2x$ with the charge number y of element A, the charge number z of element D, and $\varepsilon=0.9-1.1$,
    wherein the method comprises:
    providing a stoichiometric composition of reactants; and
    heating the reactants to a temperature ranging from 700° C. inclusive to 1100° C. inclusive.

15. A radiation emitting device comprising:
    a semiconductor chip configured to emit electromagnetic radiation of a first wavelength range;
    a conversion element comprising a phosphor with the general formula $EA_2A_4D_3O_xN_{8-x}$:RE configured to convert electromagnetic radiation of the first wavelength range into electromagnetic radiation of a second wavelength range, wherein:
    EA is selected from the group consisting of divalent elements;
    A is selected from the group consisting of monovalent elements, divalent elements, or trivalent elements;
    D is selected from the group consisting of trivalent elements or tetravalent elements;
    RE is an activator element;
    $0 \leq x \leq 8$; and
    $\varepsilon(4+4y+3z)=3(8-x)+2x$ with the charge number y of element A, the charge number z of element D, and $\varepsilon=0.9-1.1$.

16. The radiation emitting device according to claim 15, wherein an emission maximum of the phosphor ranges from 500 nanometers inclusive to 600 nanometers inclusive.

17. The radiation emitting device according to claim 15, wherein a dominant wavelength of the phosphor ranges from 550 nanometers inclusive to 580 nanometers inclusive.

18. The radiation emitting device according to claim 15, wherein a spectral half-width of the emission of the phosphor ranges from 60 nanometers inclusive to 100 nanometers inclusive.

19. The radiation emitting device according to claim 15, wherein the conversion element is free of a further phosphor.

20. The radiation emitting device according to claim 15, wherein the conversion element comprises a second phosphor configured to convert electromagnetic radiation of the first wavelength range into electromagnetic radiation of a third wavelength range.

* * * * *